(12) United States Patent
Mo et al.

(10) Patent No.: US 7,837,353 B2
(45) Date of Patent: Nov. 23, 2010

(54) LED ASSEMBLY PREVENTING ELECTROSTATIC ACCUMULATION THEREON

(75) Inventors: Ci-Jin Mo, Shenzhen (CN); Li He, Shenzhen (CN); Xiu-Yi Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 208 days.

(21) Appl. No.: 12/200,881

(22) Filed: Aug. 28, 2008

(65) Prior Publication Data

US 2010/0053961 A1    Mar. 4, 2010

(51) Int. Cl.
*F21V 21/00* (2006.01)

(52) U.S. Cl. ............... 362/249.02; 362/374; 362/457

(58) Field of Classification Search ...........................
362/249.02–249.06, 800, 249.01, 362, 374, 362/382, 457

See application file for complete search history.

(56) References Cited

U.S. PATENT DOCUMENTS

| | | | | |
|---|---|---|---|---|
| 6,431,728 | B1 * | 8/2002 | Fredericks et al. | 362/244 |
| 6,536,913 | B1 * | 3/2003 | Yajima et al. | 362/231 |
| 7,284,881 | B2 * | 10/2007 | Kim et al. | 362/290 |
| 7,566,147 | B2 * | 7/2009 | Wilcox et al. | 362/249.02 |
| 7,597,516 | B2 * | 10/2009 | Bucciferro et al. | 411/187 |
| 2005/0231949 | A1 * | 10/2005 | Kim et al. | 362/249 |
| 2007/0097684 | A1 * | 5/2007 | Obara et al. | 362/249 |

* cited by examiner

*Primary Examiner*—Bao Q Truong
(74) *Attorney, Agent, or Firm*—Frank R. Niranjan

(57) ABSTRACT

An LED assembly can effectively prevent static electricity from accumulation, comprises an LED module, a grounded support and two fasteners extending through the LED module into the support. The LED module comprises a printed circuit board having a metal substrate and two insulating layers formed on the substrate, and a plurality of LEDs mounted on the printed circuit board. Each fastener has a plurality of teeth extending downwardly through the insulating layer to abut against a top face of the substrate, to thereby electrically connect a top face of the insulating layer and the substrate.

19 Claims, 4 Drawing Sheets

LED ASSEMBLY PREVENTING ELECTROSTATIC ACCUMULATION THEREON

BACKGROUND OF THE INVENTION

1. Field of the Invention

The present invention relates to an LED assembly, and more particularly to an LED assembly comprising an electrostatic-leading structure for preventing static electricity accumulation thereon.

2. Description of Related Art

LEDs have been available since the early 1960's. Because of their relatively high light-emitting efficiency, LED usage has increased in popularity in a variety of applications, such as residential, traffic, commercial, and industrial settings. In such applications, for sufficient light output, a plurality of LED modules is incorporated in a housing which supports mounting of the LED modules thereon, and also as a heat sink dissipating heat generated by the LED modules to an atmosphere ambient. Generally, most conventional LED modules are silicon printed circuit boards with multiple LEDs fixed thereon.

Recently, there has been proposed an LED module substituting a metal printed circuit board for the conventional board, to improve heat dissipation therefrom, thereby allowing increased density of arrangement of the LEDs on the printed circuit board, thus enhancing overall light output per LED module. The metal printed circuit board requires electrical insulation from the LEDs, preventing electrical communication therebetween. Among the many attempts at insulating the metal printed circuit board from the LEDs, one example thereof sequentially forms a first insulating layer, an electrically conductive layer, and a second insulating layer on the metal printed circuit board. The first insulating layer insulates the metal printed circuit board from the electrically conductive layer, which is directly connected to electrode leads of the LEDs, supplying current thereto, the second insulating layer overlays the electrically conductive layer to prevent contact between the electrically conductive layer and other electrical terminals, which may disturb normal operation of the LEDs if in electrical connection with the electrically conductive layer. A plurality of screws with insulating washers sleeved thereon extends through the metal printed circuit board to thereby attach the LED modules to the housing.

When the LED module is tested under a high voltage value by a testing device for determining electrical parameters thereof, or after being utilized for a long period as a light source in an LED lamp, there arises a probability that static electricity may be unexpectedly generated on an external surface of the second insulating layer. Since the washers, often of electrically insulating plastic material, are present between the screws and the external surface of the second insulating layer, the external surface of the second insulating layer can be substantially insulated from the screws. The static electricity on the external surface of the second insulating layer cannot be evacuated by the screws to ground, but will remain and accumulate gradually. A significant electrostatic discharge (ESD) may therefore occur in the LED module when accumulated static electricity reaches a critical value, and current may flow into the LEDs from the electrostatic discharge, resulting in malfunction or damage to the LEDs.

What is needed, therefore, is a method for mounting an LED module on a support which can overcome the described limitations.

SUMMARY OF THE INVENTION

A method for mounting an LED module on a support comprises providing an LED module, a support and a plurality of fasteners, each comprising a head, a pole extending downwardly from a bottom of the head, and a plurality of teeth protruding downwardly from the bottom of the head and surrounding the pole, inserting the fasteners through a printed circuit board of the LED module into the support, rotating each fastener to cause the teeth thereof to scrape parts of insulating layers off a metal substrate of the printed circuit board, whereby a top face of the substrate is exposed and in direct contact with the teeth of the fastener. Accordingly, an electrically conducting pathway between a top face of the insulating layers and the top face of the substrate is formed via the fasteners, and electrostatic electricity generated on the top face of the insulating layers can flow to the support through the pathway. Therefore, malfunction or damage to the LEDs by electrostatic discharge is avoided.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
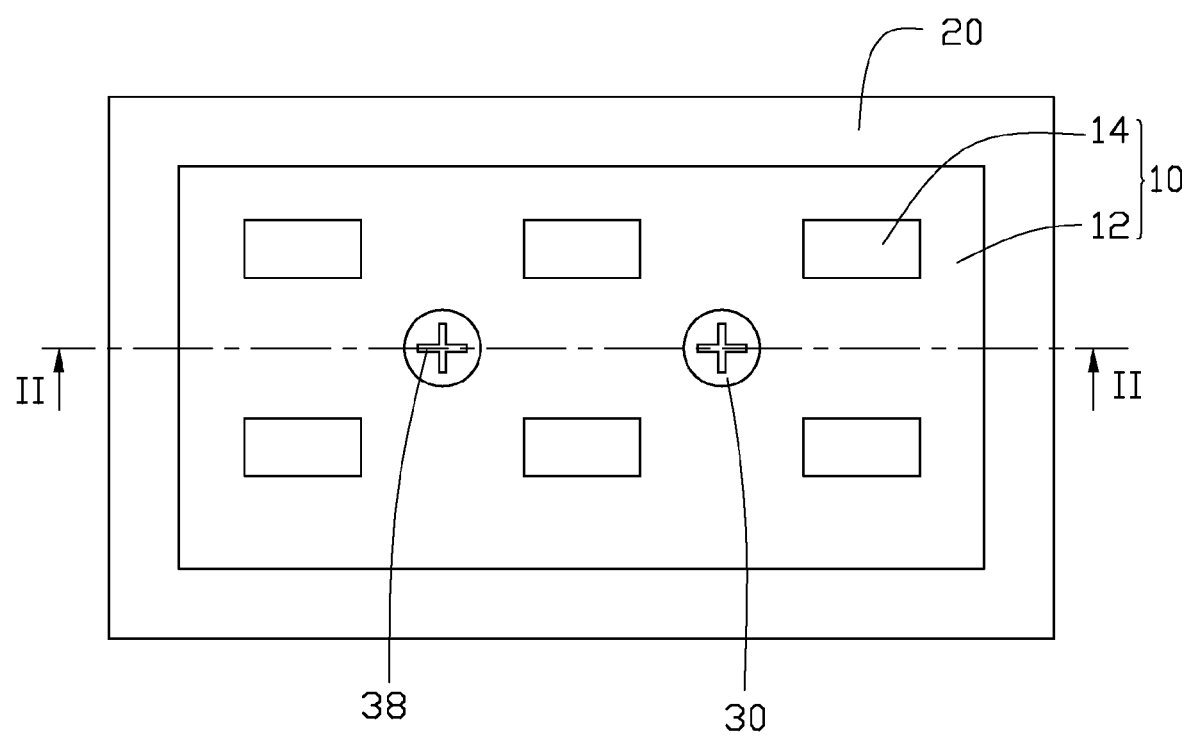
FIG. 1 is an assembled, top view of an LED assembly in accordance with an embodiment of the present invention.

FIG. 1 is a top view of an LED assembly to which the present invention is directed. The LED assembly comprises an LED module 10, a support 20, and a pair of screws 30 extending through the LED module 10 into the support 20 to thereby fix the LED module 10 onto the support 20. The LED module 10 comprises a rectangular printed circuit board 12 and a plurality of LEDs 14 uniformly arranged thereon.

Figure 2:
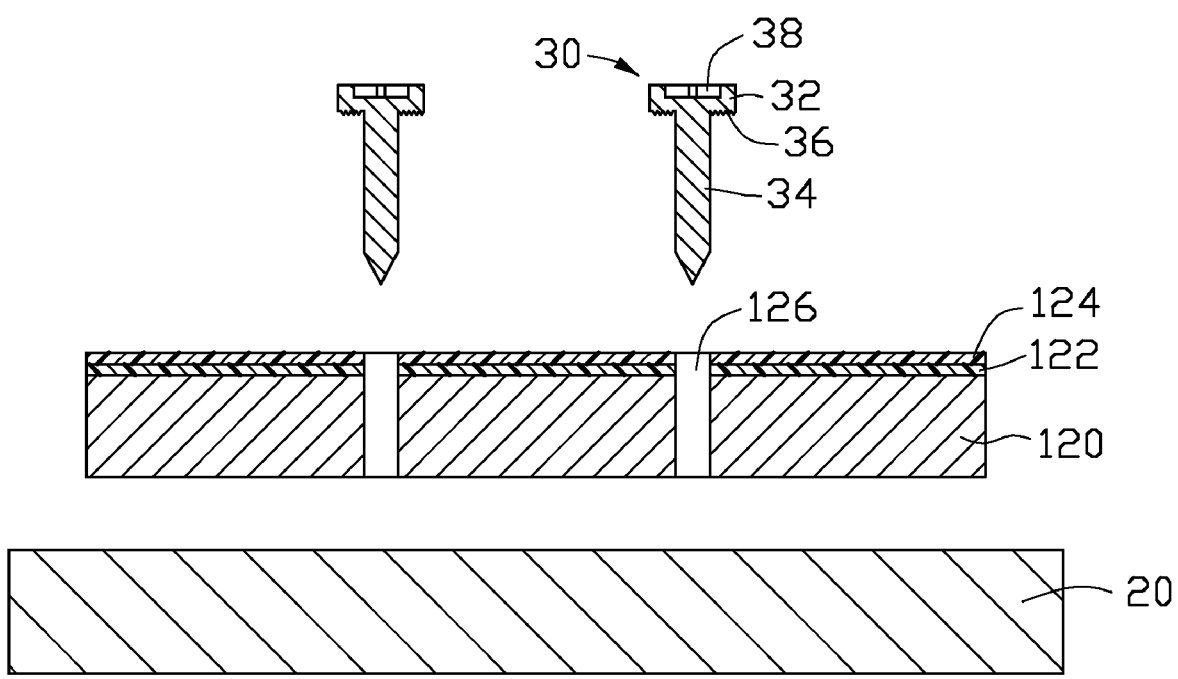
FIG. 2 is an exploded cross-section of FIG. 1 taken along line II-II, wherein two screws are detached from an LED module of the LED assembly.

Also referring to FIG. 2, the printed circuit board 12 constitutes a substrate 120 and a plurality of layers 122, 124 formed thereon. A pair of straight through holes 126 are defined in the printed circuit board 12 between the LEDs 14, receiving the screws 30 therethrough and fixing the LED module 10 on the support 20. The substrate 120 is substantially of a heat conducting material, such as copper, aluminum or an alloy thereof. The plurality of layers 122, 124 comprises a first insulating layer 122, an electrically conductive layer (not shown), and a second insulating layer 124 sequentially plated on the substrate 120. A thickness of the substrate 120 is about 1.5 mm, and a total thickness of the three layers 122, 124 is approximately 0.1 mm which is exaggerated in FIGS. 2-4. The first insulating layer 122 covers an overall top face of the substrate 120, to thereby completely insulate the electrically conductive layer from the substrate 120. The electrically conductive layer is patterned on the first insulating layer 122 avoiding positions of the LEDs 14, and away from through holes 126. The electrically conductive layer directly connects electrode leads (not shown) of the LEDs 14, providing current from a power source (not shown) thereto. The second insulating layer 124 is formed on an outermost side of the printed circuit board 12, preventing the electrically conductive layer from contacting other electrical terminals (not shown). Since there is no electrically conductive layer formed adjacent to the through holes 126, the second insulating layer 124 directly joins the first insulating layer 122 at the places shown in FIGS. 2-4.

Each screw 30 is integrally of metal and consists of a head 32 and a pole 34 extending downwardly from a bottom face thereof. The head 32 has a portion recessed downwardly in a top face thereof, thereby forming two crossed slots 38 (as viewed from FIG. 1). A plurality of teeth 36 protrudes downwardly from the bottom face of the head 32 and surrounds a top end of the pole 34. Each tooth 36 is triangular with a relatively sharp end. A plurality of spiral threads (not shown) around a circumferential face of the pole 34 interferingly engage internal threads in threaded holes (not shown) in the support 20, thus interferingly fixing the LED module 10 on the support 20.

Figure 3:
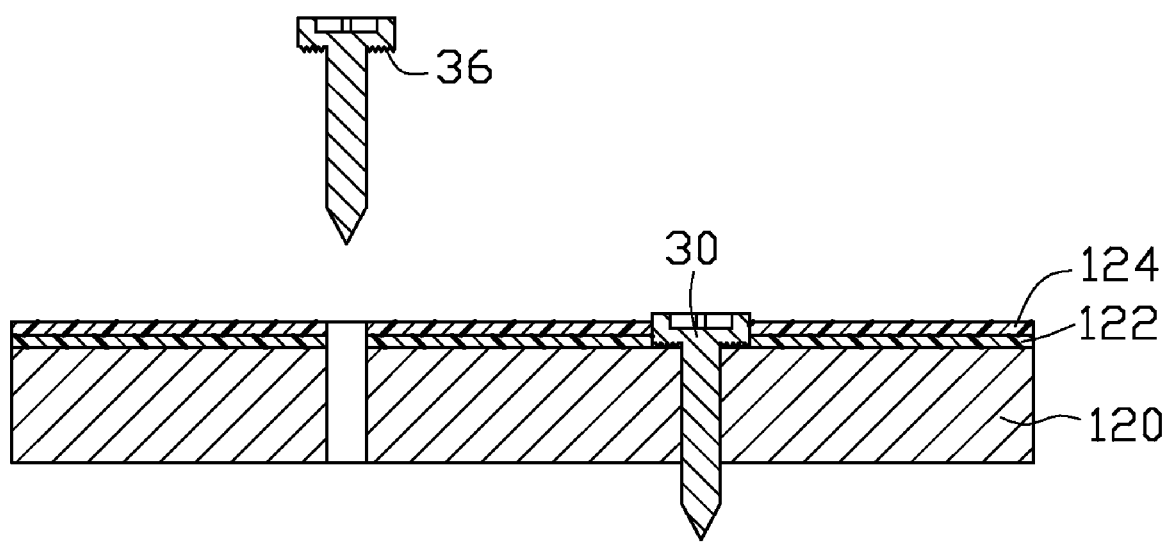
FIG. 3 is a view similar to FIG. 2, but one of the two screws is screwed into the LED module and a support of the LED assembly is removed.

Also with reference to FIG. 3, when mounting the LED module 10 on the support 20, the screws 30 are prepared to be readily inserted through the through holes 126 in the printed circuit board 12 with the teeth 36 thereof abutting a top face of the second insulating layer 124 of the printed circuit board 12. As a rotation of each screw 30 impels it downwardly toward the support 20, the teeth 36 of the screws 30 scrape annular parts of the second insulating layer 124 and the first insulating layer 122 of the printed circuit board 12 surrounding each through hole 126. Before the teeth 36 reach the top face of the substrate 120, an annular part of the top face of the substrate 120 surrounding each through hole 126 is substantially exposed. Meanwhile, rigidity of the substrate 120 prevents the ends of the teeth 36 from penetrating deep into the substrate 120, and the screws 30 are impeded from moving downwardly any further. At this time, the heads 32 of the screws 30 project out of the second insulating layer 124, establishing an electrical connection with the top face of the second insulating layer 124, and the poles 34 of the screws 30 are threaded in the support 20, thereby firmly fixing the LED module 10 on the support 20.

By removing the annular parts of the first insulating layer 122 and the second insulating layer 124 near the screws 30 from the substrate 120, the head 32 of the screw 30 is in direct contact with the substrate 120 and electrical connection with the top face of the second insulating layer 124 of the printed circuit board 12. Static electricity produced on the top face of the second insulating layer 124, is conductable via the screws 30 to the substrate 120 which is grounded beforehand. Thus, malfunction of or damage to the LEDs 14 due to electrostatic discharge is avoided.

Further, to ensure that the annular parts of the first and second insulating layers 122, 124 surrounding the through holes 126 can be completely cleared, the screws 30 can be continuously rotated downwardly to scrape a top portion of the substrate 120 under large force, after engaging the top face of the substrate 120. Thickness of portion scraped off the substrate 120 varies, commensurate with the force applied, with preferably, in the present invention, the thickness of the scraped portion being about 0.2 mm.

Figure 4:
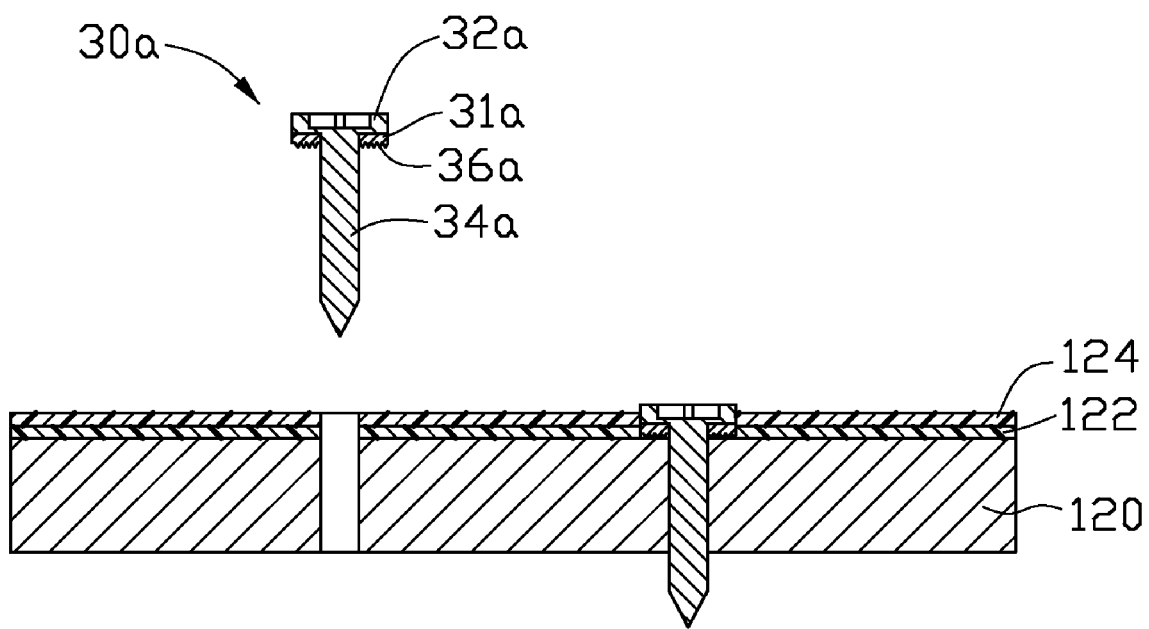
FIG. 4 is a view similar to FIG. 3, with configurations of the two screws varied.

Alternatively, the screws 30 can be replaced with other elements as long as the same functionality is provided. Practicable among such elements, as shown in FIG. 4, is a fastening assembly 30a replacing the former integrally formed screw 30. The fastening assembly 30a comprises a screw (not labeled) which has a head 32a, a pole 34a extending downwardly from a bottom face of the head 32a, and a metal annulus 31a detachably sleeved on the pole 34a of the screw. The annulus 31a has a circumference corresponding to that of the head 32a of the screw. A plurality of teeth 36a projects downwardly from the bottom face of the annulus 31a. The teeth 36a perform the same function as those of the former screws 30, that is, scraping the first and second insulating layers 122, 124 off the substrate 120 of the printed circuit board 12. Note that the screw and the annulus 31a of the fastening assembly 30a actually equal two corresponding separated parts of the prior screw 30, respectively. It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED assembly comprising:
    an LED module comprising a printed circuit board and a plurality of LEDs mounted thereon;
    a grounded support; and
    an electrically conductive fastener extending through the printed circuit board into the support to fix the LED module on the support;
    wherein the printed circuit board comprises a metal substrate and an insulating layer formed on a top face thereof, a trough being defined in the insulating layer to expose the top face the substrate; and
    wherein an end of the fastener is received in the trough and in direct contact with the top face of the substrate and electrical connection with a top face of the insulating layer whereby static electricity produced on the top face of the insulating layer is conductable via the fastener to the substrate which is grounded.

2. The LED assembly as claimed in claim 1, wherein the printed circuit board has a through hole defined therethrough, the through hole receiving the fastener therein and being surrounded by the trough.

3. The LED assembly as claimed in claim 1, wherein the trough is extended to a lower level spaced 0.2 mm from the top face of the substrate.

4. The LED assembly as claimed in claim 1, wherein the fastener comprises a head, a pole extending downwardly from a bottom of the head, and a plurality of teeth extending downwardly to be in direct contact with the top face of the substrate.

5. The LED assembly as claimed in claim 4, wherein the plurality of teeth surrounds an upper end of the pole.

6. The LED assembly as claimed in claim 4, wherein the plurality of teeth is formed from the bottom of the head.

7. The LED assembly as claimed in claim 4, wherein the fastener further comprises an annulus detachably sleeved on the pole, the plurality of teeth being formed from a bottom of the annulus.

8. The LED assembly as claimed in claim 4, wherein the head of the fastener projects outside of the insulating layer.

9. The LED assembly as claimed in claim 4, wherein each of the plurality of teeth is triangular.

10. The LED assembly as claimed in claim 1, wherein the trough is formed by milling.

11. An LED assembly comprising:
an LED module comprising a printed circuit board and a plurality of LEDs mounted on the printed circuit board;
a grounded support; and
a fastener extending through the printed circuit board and into the support;
wherein the printed circuit board comprises a metal substrate and an insulating layer formed on the substrate; and
wherein the fastener has a plurality of teeth formed at an upper portion thereof, the plurality of teeth extending through the insulating layer and abutting against the substrate of the printed circuit board to thereby electrically connect a top face of the insulating layer and the substrate whereby static electricity produced on the top face of the insulating layer is conductable via the fastener to the substrate which is grounded.

12. The LED assembly as claimed in claim 11, wherein the fastener is a screw, the plurality of teeth being extended from a head located at the upper portion of the screw.

13. The LED assembly as claimed in claim 11, wherein the fastener comprises a screw and an annulus detachably sleeved on the screw, the plurality of teeth being formed from the annulus.

14. The LED assembly as claimed in claim 11, wherein the plurality of teeth forms an annular groove in the substrate by scraping with the substrate.

15. The LED assembly as claimed in claim 14, wherein a depth of the annular groove is 0.2 mm.

16. The LED assembly as claimed in claim 11, wherein a top face of the fastener is located higher than the top face of the insulating layer of the printed circuit board.

17. The LED assembly as claimed in claim 11, wherein each of the plurality of teeth has a sharp extremity extending toward the support.

18. The LED assembly as claimed in claim 1, wherein the printed circuit board further comprises another insulating layer below the insulating layer and an electrically conductive layer between the insulating layer and the another insulating layer.

19. The LED assembly as claimed in claim 11, wherein the printed circuit board further comprises another insulating layer below the insulating layer and an electrically conductive layer between the insulating layer and the another insulating layer.

* * * * *